(12) United States Patent
Mardi et al.

(10) Patent No.: US 8,310,253 B1
(45) Date of Patent: Nov. 13, 2012

(54) HYBRID PROBE CARD

(75) Inventors: Mohsen H. Mardi, Saratoga, CA (US);
Elvin P. Dang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 614 days.

(21) Appl. No.: 12/502,511

(22) Filed: Jul. 14, 2009

(51) Int. Cl.
*G01R 31/20* (2006.01)
*G01R 1/067* (2006.01)

(52) U.S. Cl. ............... 324/754.01; 324/755.01

(58) Field of Classification Search .. 324/754.01–754.3, 324/762.01–762.1, 755.01–755.11, 757.01–757.04; 257/48; 438/14–18
See application file for complete search history.

(56) References Cited

U.S. PATENT DOCUMENTS

| | | | |
|---|---|---|---|
| 6,724,207 B1 * | 4/2004 | Chen | 324/756.03 |
| 7,535,239 B1 | 5/2009 | Dang et al. | |
| 2006/0250150 A1 * | 11/2006 | Tunaboylu et al. | 324/754 |

* cited by examiner

*Primary Examiner* — Tung X Nguyen
(74) *Attorney, Agent, or Firm* — Mark E. Courtney; LeRoy D. Maunu

(57) ABSTRACT

A hybrid probe card and methods are provided. A plurality of uniform sized probe pins are provided in a probe card for performing wafer probe testing. The probe card also includes at least one enlarged probe pin having a current carrying capacity that is at least 25% greater than the current carrying capacity of the uniform sized probe pins. The enlarged probe pins are provided, e.g., to prevent damage to the probe pins caused by large current flow. Methods for identifying the probe pin locations where the enlarged probe pins should be deployed are described.

20 Claims, 4 Drawing Sheets

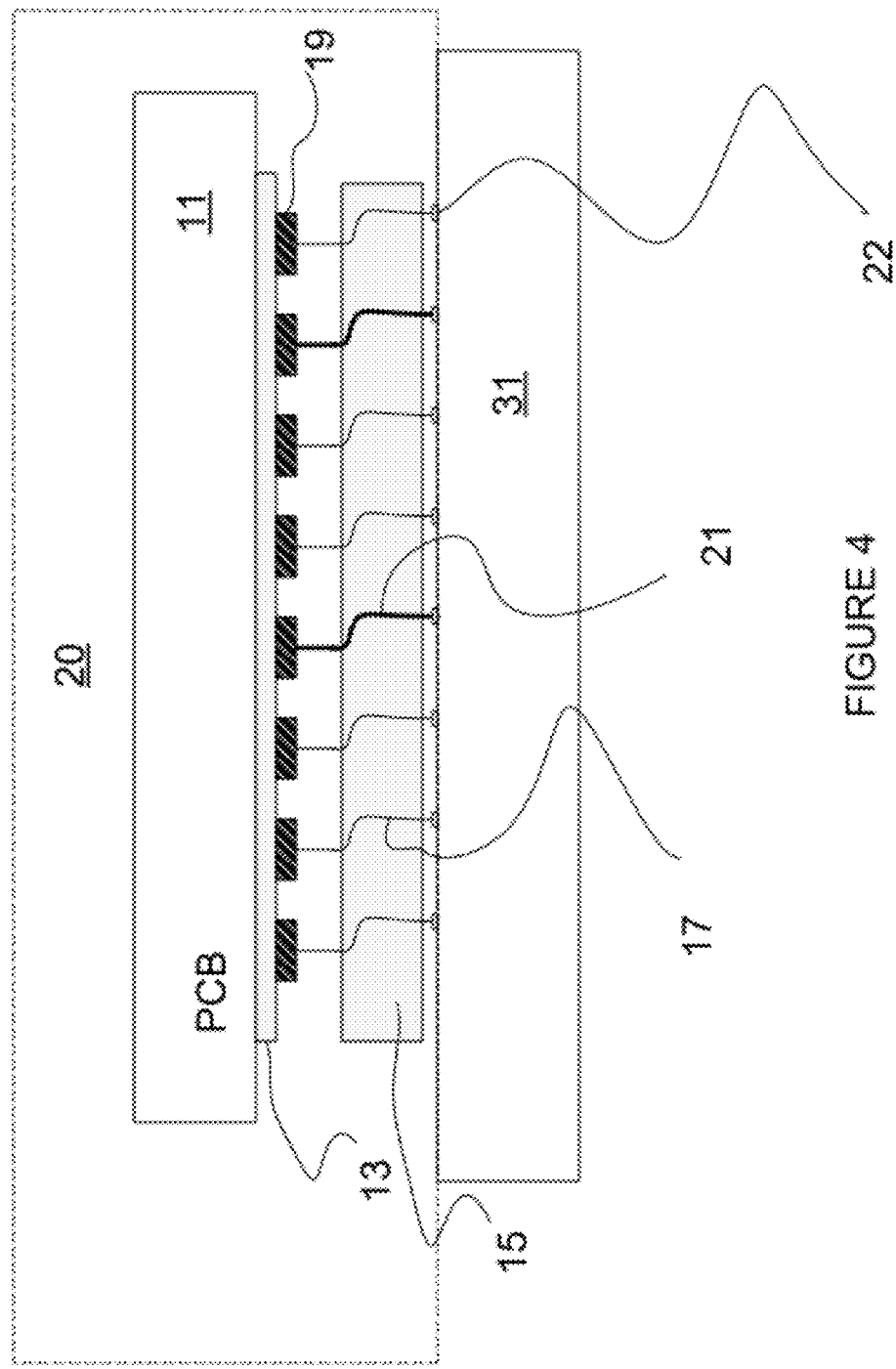

HYBRID PROBE CARD

FIELD OF THE INVENTION

One or more embodiments of the present invention relate to a probe card for use in test and verification of circuitry and semiconductor wafers. In particular, one or more embodiments of the invention relate to the test and verification of integrated circuits (ICs) fabricated on a semiconductor wafer prior to singulation into integrated circuit dice, or the verification of packaged integrated circuits. An improved probe card and methods directed to the verification of integrated circuits are provided.

BACKGROUND

In the wafer probe tests of semiconductor wafers, including integrated circuits formed on the semiconductor wafers, probe cards are used. The probe cards provide an electrical coupling between a tester or probe station and the semiconductor wafer being probed. The integrated circuits are provided as a plurality of integrated circuit devices (often referred to as "dice" or "bars") on a planar semiconductor wafer.

The signals that provide power, ground, and input and output signals are electrically coupled to bond pads that are the electrical terminals for the integrated circuit. Because full operational tests and packaging processes for each integrated circuit are very expensive, probe testing is used to verify functionality of the integrated circuit devices and to identify the bad devices prior to the step of singulation. In singulation, the wafer is sawed or separated by laser cutting, mechanical sawing or other means into a plurality of integrated circuit dice. The probe tests provide a method to ensure that only functional devices are processed further. After the singulation process, the ICs are packaged into dual inline packages (DIPs), ball grid array (BGA) and micro-BGA packages, stacked packages, and the like. Because the packaging materials and process steps are quite expensive, tests at probe stations are used to prevent bad devices from being processed further.

Many types of integrated circuits are formed on semiconductor wafers and are subjected to probe testing. For example, programmable logic devices (PLDs) including field programmable gate arrays (FPGAs) and complex programmable logic devices (CPLDs), memory devices including DRAMs and SRAMs, non-volatile devices such as FLASH and EEPROMs, processors including digital signal processors and microprocessors are all formed as integrated circuits on semiconductor wafers and all of these devices may be subjected to wafer probe testing.

Probe cards are used with probe test stations. The probe card provides a means to engage probes with the lands or bond pads of the integrated circuits while they are still physically together on the semiconductor wafer. The probe pin tips are maintained in a precise alignment pattern with the lands or pads on the wafer. The probes are flexible and may be slightly mechanically compressed, that is, they are designed to have a spring function. This is important so the probes can be aligned with the probe points on the wafer and then brought gently into electrical and physical contact with the corresponding bond pad or ball land. The tester can then apply power and ground to one or more of the integrated circuit dice. By inputting signals into the input pins, providing power and ground signals to the appropriate pins, and capturing signals from the output pins, the wafer probe test may exercise one or more of the integrated circuit dice while it is still part of the wafer, thus verifying that it is a functional device.

Various probe card designs are known in the art. Vertical probe cards provide a generally vertical arrangement of the probe pins on an array of probes. These cards may probe one, two, or many integrated circuit dice in parallel. Many hundreds or even thousands of probes may be used. Probe cards of this type are described, for example, by U.S. Pat. No. 7,535,239, entitled "Probe Card Configured for Interchangeable Heads", issued May 19, 2009, having common inventorship and co-ownership with the present application, which is hereby incorporated in its entirety herein.

Other probe card arrangements are also used in the semiconductor manufacturing field, including horizontal, cantilever, membrane, spring probes, buckling beam probes, and others known to those skilled in the art.

In order to limit the number of probes and probe pins needed on a probe card to a reasonable number, probe cards are designed with certain techniques. One known technique is to identify repeated pins or bond pads on the IC that are coupled to a power supply, and to probe only a few of these pads. The wafer probe tip may damage the surface of the bond pads that are probed so there is an advantage to not probing every pad. Further, the power pads (Vdd, Vss, Ground) are coupled electrically inside the integrated circuit in parallel, and so it is possible to test the integrated circuit without probing all of these pads. The wafer test probe station need only provide sufficient power and ground connections to operate the integrated circuit for testing.

However, problems with the probe pins of the prior art probe cards sometimes occur. When a power signal or ground signal is probed in this manner, the current flowing through the tip of the probe may spike on certain events. These current spikes, when repeated over many test cycles, may cause the probe tip to "burn". Probe cards are expensive and so are intended to be repeatedly used to test many wafers. The probe pins should remain uniform in shape and have uniform contact resistance so that consistent test results are obtained for each wafer probed. If this is not the case, then the test results may falsely indicate a device is not functional, or other problems with testing may occur. A burned probe tip has experienced thermal stress due to over current. This burn damage can affect its operation by changing the shape and the contact resistance of the probe tip.

Presently, known probe pins are typically rated for 75-100 milliamperes of current. The probe pins for a prior art probe card are uniform in size; typically, the probe pins are about 3 mils in diameter. However and particularly when a limited number of probe pins are used to probe a power signal, or other high current signal, over time the probe pin may become misshapen and contact resistance may increase. This probe pin damage then requires repair of the probe card, increasing test time and costs. If a repair is not made, the probe card may not perform correctly.

FIG. 1 depicts a prior art probe card 10 arranged as a vertical probe card. In FIG. 1, a substrate 11 is provided. Substrate 11 is typically a printed circuit board (PCB) and has traces and vias that are formed (not shown) to make electrical connections to the probe pins on the probe card. A multiple layer organic (MLO) or multiple layer ceramic (MLC) portion 13 is provided and supports electrically conductive pads or lands 19. The pads are a good conductor material, typically gold or gold alloys, although copper, palladium, palladium plated nickel, nickel plated over copper, copper, copper alloys and copper nickel layers, and other known conductive pad materials may also be used. Substrate 11 includes conductors and vias to provide electrical connections between the probe pins 17 and a wafer probe tester (not shown) for use in powering and testing the device being probed. Typically, probe cards 10 are used to probe wafers with integrated circuit devices fabricated on them, but they could also be used to test packaged integrated circuit devices, circuit boards, thin film circuits, printed circuits, membranes with conductors formed on them and other devices as well.

Probe pins 17 are each coupled to a corresponding one of these pads 19. Probe head 15 is formed to provide mechanical support and to ensure the alignment of the probe pins 17. Probe head 15 is made of, for example, a ceramic housing with holes provided on top and bottom of the housing, a top guide plate and a bottom guide plate, and a thin Mylar in the middle of the head. The probe head thickness is about 4.0-4.5 millimeters but could be more or less than this thickness. The probe head 15 provides physical support and alignment of the probe pins 17. The free end of probes 17, such as end 18, is then available to be placed into physical and electrical contact with a semiconductor wafer. In the prior art probe card 10 of FIG. 1, each probe tip 17 is of uniform diameter and therefore uniform current carrying capacity. The probe card 10 is brought into physical and electrical contact with the wafer under test and each probe tip 17 touches down on a corresponding bond pad or ball land of the integrated circuit(s) on the wafer. Some probe cards test one integrated circuit on the wafer in a "step and repeat" fashion, while others may test multiple integrated circuit devices in parallel by having probe pins mapped to multiple integrated circuit devices. A unique probe card 10 may be designed for each type of wafer to be tested. Alternatively, for example, for commodity type devices such as DRAMs, the pad layout for the integrated circuit dies and the wafer may be made common so that a standardized probe card may be used with a variety of wafers having a common pad layout. More typically, a specific probe card is designed for each type of wafer to be produced as the universal probe cards have not been as practical.

A continuing need thus exists for a probe card that provides reliable wafer probe testing over a lengthy period of time without burning the probe pins and without the need for replacing certain pins due to over current situations.

SUMMARY

These and other problems are generally solved or circumvented, and technical advantages are generally achieved, by advantageous embodiments of the present invention which include methods and apparatuses for providing a hybrid probe card with non-uniform sized probe pins. The probe pins used for certain higher current situations are enlarged to add additional current carrying capability for those particular probe pins, while the remaining probe pins may remain at the nominal size.

In an exemplary embodiment, an apparatus is provided having a circuit board; a substrate overlying the circuit board; conductor pads on the circuit board to provide electrical connections; a probe head overlying and spaced apart from the conductor pads; and a plurality of uniform sized probe pins supported by the probe head. In this embodiment, each of the plurality of uniform sized probe pins is provided having one end coupled to a respective one of the conductor pads. In this embodiment, the apparatus further comprises at least one non-uniform sized probe pin supported by the probe head. One end of the at least one non-uniform sized probe pin is coupled to a respective one of the conductor pads. Each of the at least one non-uniform sized probe pin has a diameter that is at least 25% thicker than a diameter of each of the plurality of uniform sized probe pins.

In this embodiment, each of the at least one non-uniform sized probe pin can have a greater current carrying capacity than each of the plurality of uniform sized probe pins. The at least one non-uniform sized probe pin can be coupled to corresponding at least one power pad on a semiconductor wafer to be probed. The at least one non-uniform sized probe pin is coupled to a corresponding at least one ground pad on a semiconductor wafer to be probed. A particular one of the at least one non-uniform sized probe pin can be coupled to a first power pad on a semiconductor wafer, where the first power pad has the same power level as a second power pad on the semiconductor wafer, where the second power pad is coupled to another one of the at least one non-uniform sized probe pin. Each of the plurality of uniform sized probe pins can have a diameter of 2.5-3 mils. Each of the at least one non-uniform sized probe pin can have a diameter of 3.5-5 mils. Each of the at least one non-uniform sized probe pin can carry, without physical damage, for example, at least twice as much current as each of the plurality of uniform sized probe pins.

In yet another exemplary embodiment, a method is provided that includes the following steps: providing a semiconductor wafer having an integrated circuit; providing a plurality of bond pads on the integrated circuit; providing a probe card having a plurality of probe pins for testing the integrated circuit; aligning the probe card with the semiconductor wafer; and contacting the semiconductor wafer by probing the plurality of bond pads with tips of the plurality of probe pins to make contact with the semiconductor wafer. In this embodiment, the integrated circuit is tested by: applying power to a first subset of the plurality of bond pads; grounding a second subset of the plurality of bond pads; inputting signals to a third subset of the plurality of bond pads; and receiving signals, using the plurality of probe pins of the probe card, from a fourth subset of the plurality of bond pads. This embodiment includes providing uniform sized probe pins and at least one non-uniform sized probe pin, and each of the at least one non-uniform sized probe pin has a current carrying capacity at least 25% larger than the current carrying capacity of each of the uniform sized probe pins.

In this embodiment, each of the uniform sized probe pins can have a diameter of 2.5-3 mils. Each of the at least one non-uniform sized probe pin can have a diameter greater than 3.5 mils. Each of the at least one non-uniform sized probe pin can have a diameter between 3.5 mils to 5 mils. Each of the uniform sized probe pins can have a current carrying capacity of 75-100 milliamperes. Each of the at least one non-uniform sized probe pin can have a current carrying capacity of at least 125 milliamperes.

In another exemplary embodiment, a method for fabricating a probe card includes: providing an initial wafer probe card having uniform sized probe pins disposed at predetermined locations corresponding to bond pads for an integrated circuit to be probed while it is on a semiconductor wafer; performing wafer probe tests on the integrated circuit using the wafer probe card; and identifying ones of the uniform sized probe pins that indicate damage due to current flow beyond the current carrying capacity of the uniform sized probe pins. In this embodiment, the method further includes forming another wafer probe card having uniform sized probe pins and non-uniform sized probe pins, where the non-uniform sized probe pins are located at locations corresponding to the locations of the identified ones of the uniform sized probe pins. In this embodiment, each of the non-uniform sized probe pins have a current carrying capacity at least 25% greater than each of the uniform sized probe pins.

In this embodiment, each of the uniform sized probe pins can have a diameter of 2.5-3 mils. Each of the non-uniform sized probe pins can have a diameter of 3.5-5 mils. The step of identifying ones of the uniform sized probe pins can further include: identifying locations of the bond pads for the integrated circuit to be probed by the initial wafer probe card during functional testing of the integrated circuit at a wafer probe station; using a circuit simulation tool, simulating the current that flows at the identified locations of the bond pads during the functional testing; comparing, for each location of the bond pads, the maximum current indicated by the circuit simulation tool to the current carrying capacity of a corresponding one of the uniform sized probe pins; and identifying locations of the bond pads where the maximum current exceeds the current carrying capacity of the uniform sized probe pins.

In this embodiment, each of the uniform sized probe pins can have a current carrying capacity of 75-100 milliamperes. Each of the non-uniform sized probe pins can have a maximum current carrying capacity of about 175 to about 250 milliamperes.

The foregoing has outlined rather broadly the features and technical advantages of certain exemplary embodiments of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention.

BRIEF DESCRIPTION OF THE DRAWINGS

For a more complete understanding of the invention, and the advantages thereof, reference is now made to the following descriptions taken in conjunction with the accompanying drawings, in which:

FIG. 4 illustrates a wafer test being performed using an embodiment of the hybrid probe card of the invention.

DETAILED DESCRIPTION

Figure 2:
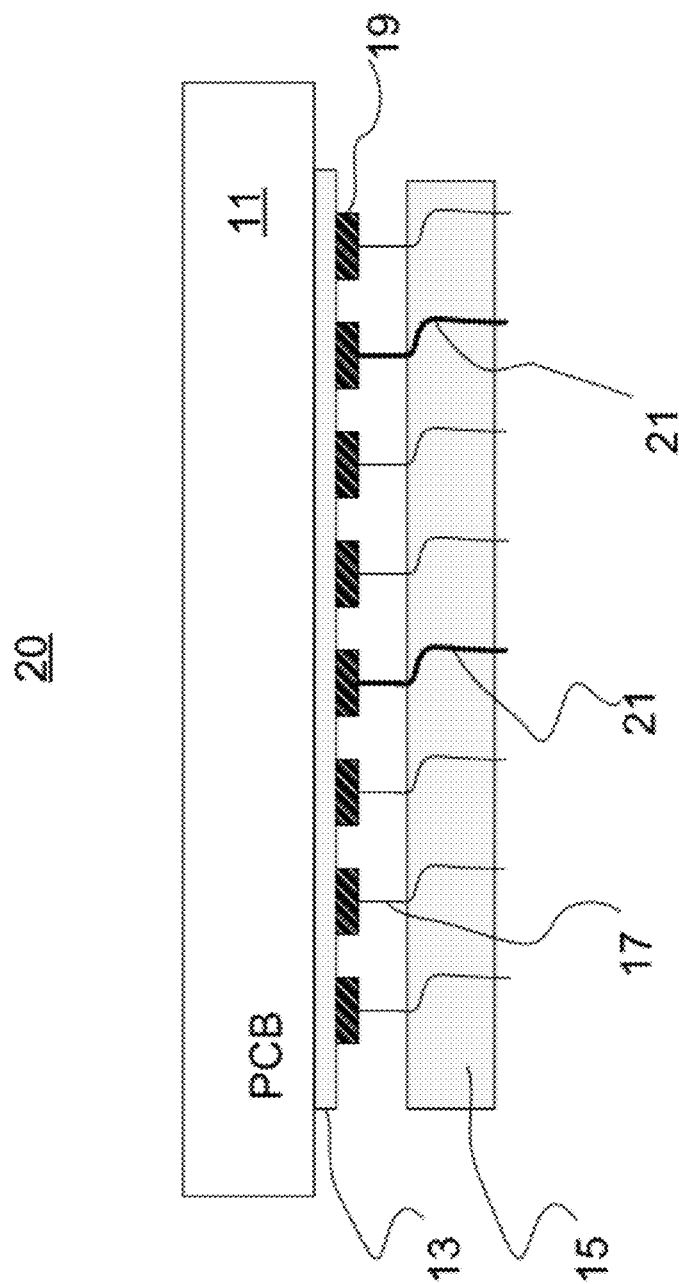
FIG. 2 illustrates an embodiment of the hybrid probe card incorporating features of the invention.

FIG. 2 illustrates a first exemplary embodiment of a hybrid probe card 20 of the present invention.

Figure 1:
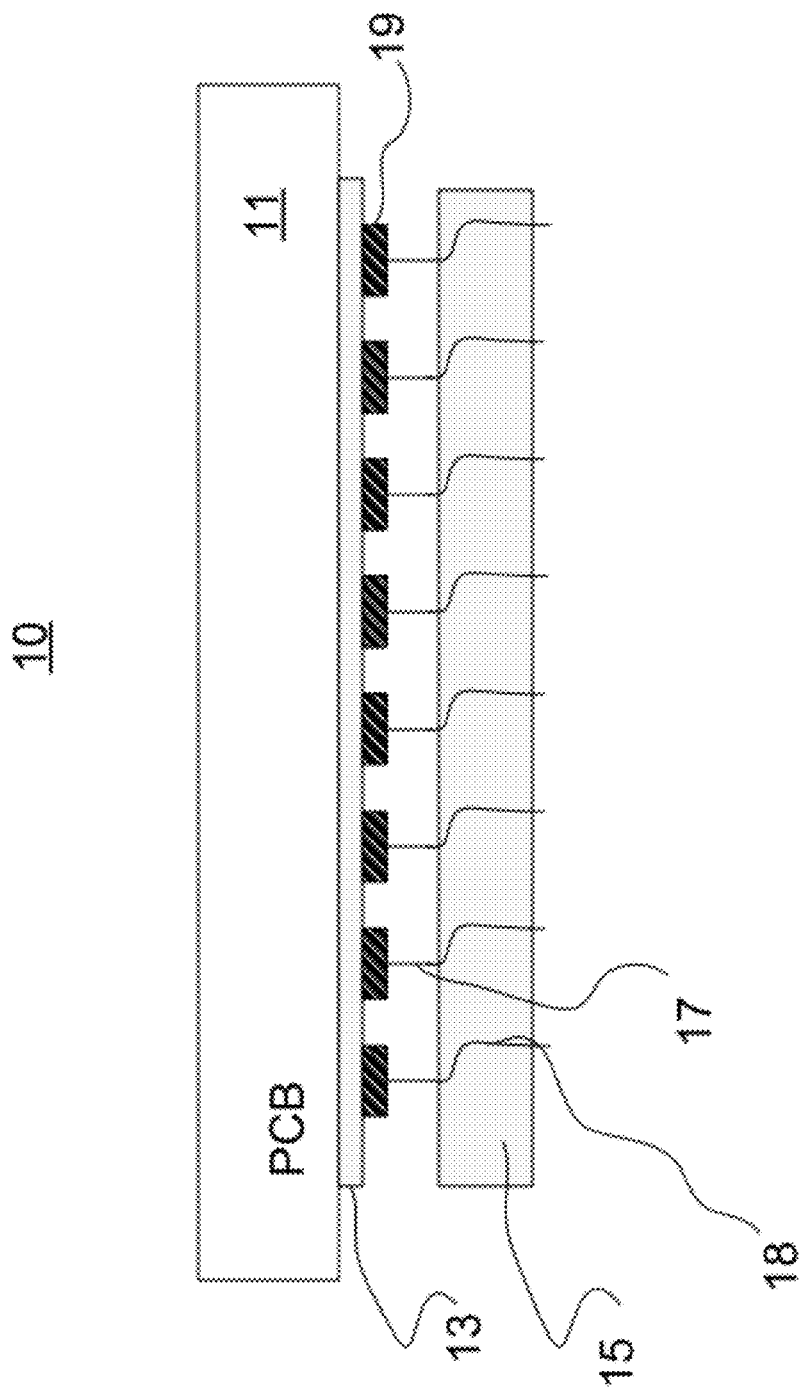
FIG. 1 illustrates a prior art probe card.

In FIG. 2, printed circuit board ("PCB") 11, pads 19, substrate 13, and supporting pads 19 are arranged generally as shown in FIG. 1. Probe pins 17 are of the same size and current carrying capacity; that is, probe pins 17 have uniform size and uniform current carrying capacity. In addition, probe head 15 supports new probe pins 21 to form the hybrid probe card 20. Probe pins 21 are enlarged to carry additional current without damage or burning of the probe tips. Probe pins 21 may be, for example, 3.5-5.0 mils in diameter and in one exemplary embodiment are 3.5-4.0 mils in diameter. Probe pins 21 are made of, for example, a commercially available probe material such as Paliney 7, or similar materials. Conductive metals such as copper, gold, nickel, palladium, platinum, tungsten, tungsten rhenium, beryllium copper and the like and alloys containing any of these or other conductors are alternative materials for the probe pins 21. Materials that may be used may be tempered, and in certain applications the use of non-corrosive, non- reactive and durable conductors are desirable. The enlarged probe pins 21 may carry, as non-limiting examples, maximum currents such as a range from 175 milliamperes to 250 milliamperes without damage. Thus, the enlarged probe pins may carry maximum current of at least 25%, more than the probe pins of the prior art. In exemplary embodiments, the current carrying capacity for the enlarged probe pins may be approximately 100% more (or doubled) than the current carrying capacity for probe pins of the prior art.

For an exemplary embodiment, one, two or several of the enlarged probe pins may be used for each integrated circuit that the probe card will contact. Typically, the enlarged probe pins are used for the power, ground or other high current signals that are to be probed. Often the higher current occurs because only one or two probe pins are used for the positive power supply or ground during a probe wafer test, even though the integrated circuit may in fact have many power and ground pads for use in a system application. This use of a few of the available power pads causes extra current to flow on the pads that are probed, and thus causes the probe pins to carry the extra current.

In one method embodiment, the embodiment probe pins 21 that are of larger diameter may be placed on pads that are known to the chip designer. In order to reliably use the larger probe, it may be desirable to form a larger bond pad at those particular pad locations. This embodiment approach may place a slight burden on the integrated circuit designer; however, it is relatively easy to form the larger bond pads during design of the IC devices. This step may not be necessary if the normal or typical bond pad size for a design is already sufficient for the larger probe pins 21.

Figure 3:
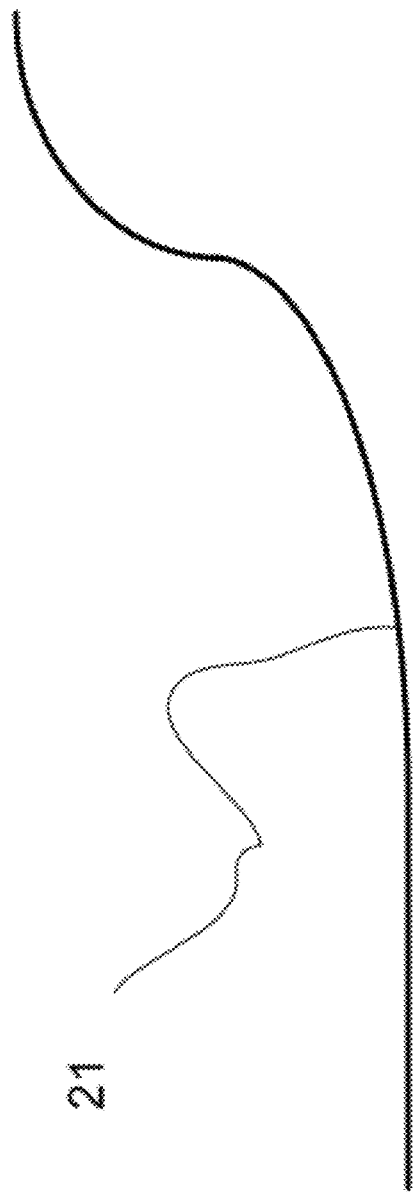
FIG. 3 illustrates a probe pin embodiment of the invention.

FIG. 3 depicts one exemplary embodiment of the hybrid probe pins 21. The shape of the probe pins may vary, but generally the cross-sectional area should be maintained. That is, if the probe pin is formed flatter in a portion to enable bending or to create the spring action needed to permit the mechanical compression used to probe a wafer, the cross-sectional area of the probe pin needs to be maintained to avoid limiting the current carrying capacity of the probe pin in the flatter section. Many shapes are possible and are contemplated as alternative embodiments of the present invention.

FIG. 4 depicts in one non-limiting example the probe card 20 embodiment in use in probing a semiconductor wafer 31. Wafer 31 is placed in physical proximity to and in alignment with the probe card 20. The probe card 20 and wafer 31 are then placed in physical contact by advancing one or the other toward the other one, so that the tips of the probe pins 17 and 21 make electrical and physical contact with bond pads 22 on the semiconductor wafer 31. The probe card 20 may form connections to one, two, or many integrated circuits on the semiconductor wafer and functional wafer probe tests may be performed by applying power and ground signals to the integrated circuit and providing input signals, while the output signals coupled to the probe pins are captured and analyzed. A determination of whether a particular integrated circuit device passes the tests is made. Wafer scale probe cards could be formed so that an entire wafer may be tested in one pass or in several passes. The integrated circuits on wafer 31 may be of any type including programmable logic devices, complex programmable logic devices (CPLDs), field programmable gate arrays (FPGAs), memory devices including dynamic and static type memory devices and non-volatile memory such as FLASH and EPROM, processor, mixed signal, analog, and other semiconductor devices may be formed on wafer 31.

The probe card 20 may be formed in alternative probe card embodiment configurations such as cantilever, spring, buckling beam, etc. probe cards instead of the vertical probe card as shown. These alternative embodiments are also contemplated as within the scope of the present invention and are covered by the appended claims.

The method of determining which of the probe pin should be the enlarged probe pins 21 is also an aspect in one embodiment of the invention. In one embodiment method, electrical circuit simulations may be performed assuming one, two or more Vcc/Vdd or ground connection probes and current maximum levels may be estimated by the simulation. For example, SPICE or other circuit simulation tools may be used. If the current expected for a particular pin from this simulation exceeds the rated current capacity for the uniform or nominal probe pins, then the enlarged probe pins should be used for that particular pad and probe card signal. By using only a few enlarged probes for these signals, additional probe pin locations may be available for more signal probes without otherwise changing the probe card.

Alternatively, observation of a prior art probe card used to perform probe tests of a wafer may be made. Probe pins that are damaged in normal testing or "burned" may be identified, and replaced with the new larger probe pins to form a hybrid probe card. This exemplary embodiment probe card may then be used without the damage to the probe pins that occurred using the probe cards of the prior art, thus increasing reliability, reducing down time, and reducing costs.

The embodiments described above may also be provided as a complete probe card in any configuration including vertical, cantilever probe, buckling beam probe and spring probe cards. The number of enlarged probe pins may be limited to as few as one that is larger than the remaining, uniform sized pins. Alternatively, there may be a number of enlarged probe pins. Use of the enlarged probe pins with higher current carrying capacity may reduce the need for multiple probe pins probing the same power supply or ground signals on an integrated circuit, thereby providing additional probe pin capacity for other signals.

The term "on" or "thereon" as used in the specification and the claims includes when components (e.g., pads) are in physical contact and also when components are separated by one or more intervening components.

These alternative implementations are contemplated as additional embodiments of the present invention and are within the scope of the appended claims. Those skilled in the art will recognize that many obvious modifications to the exemplary embodiments may be made while still using the disclosed inventions. For example, some of the terms used in the foregoing and the appended claims are chosen with regard to the presently used terms in the relevant art and being used in draft standards presently in work. Changes in these terms and abbreviations over time by use in industry and in standard drafting are contemplated and do not change the scope of the inventions disclosed nor limit the scope of the appended claims. These modifications are contemplated as additional embodiments, are considered as within the scope of the invention and fall within the scope of the appended claims.

What is claimed is:

1. An apparatus, comprising:
   a circuit board;
   a substrate overlying the circuit board;
   conductor pads on the circuit board to provide electrical connections;
   a probe head overlying and spaced apart from the conductor pads;
   a plurality of uniform sized probe pins supported by the probe head and each of the plurality of uniform sized probe pins having one end coupled to a respective one of the conductor pads; and
   at least one non-uniform sized probe pin supported by the probe head and having one end of the at least one non-uniform sized probe pin coupled to a respective one of the conductor pads;
   wherein each of the at least one non-uniform sized probe pin has a greater current carrying capacity than each of the plurality of uniform sized probe pins.

2. The apparatus of claim 1, wherein each of the at least one non-uniform sized probe pin has a diameter that is at least 25% thicker than a diameter of each of the plurality of uniform sized probe pins.

3. The apparatus of claim 1, wherein the at least one non-uniform sized probe pin is coupled to corresponding at least one power pad on a semiconductor wafer to be probed.

4. The apparatus of claim 1, wherein the at least one non-uniform sized probe pin is coupled to corresponding at least one ground pad on a semiconductor wafer to be probed.

5. The apparatus of claim 1, further comprising a particular one of the at least one non-uniform sized probe pin coupled to a first power pad on a semiconductor wafer, wherein the first power pad has the same power level as a second power pad on the semiconductor wafer, wherein the second power pad is coupled to another one of the at least one non-uniform sized probe pin.

6. The apparatus of claim 1 wherein each of the plurality of uniform sized probe pins has a diameter of 2.5-3 mils.

7. The apparatus of claim 6, wherein each of the at least one non-uniform sized probe pin has a diameter of 3.5-5 mils.

8. The apparatus of claim 1, wherein each of the at least one non-uniform sized probe pin can carry, without physical damage, at least twice as much current as each of the plurality of uniform sized probe pins.

9. A method, comprising:
   providing a semiconductor wafer having an integrated circuit;
   providing a plurality of bond pads on the integrated circuit;
   providing a probe card having a plurality of probe pins for testing the integrated circuit;
   aligning the probe card with the semiconductor wafer;
   contacting the semiconductor wafer by probing the plurality of bond pads with tips of the plurality of probe pins to make contact with the semiconductor wafer; and
   testing the integrated circuit by:
      applying power to a first subset of the plurality of bond pads;
      grounding a second subset of the plurality of bond pads;
      inputting signals to a third subset of the plurality of bond pads; and
      receiving signals, using the plurality of probe pins of the probe card, from a fourth subset of the plurality of bond pads;
   wherein providing the probe card further comprises providing uniform sized probe pins and at least one non-uniform sized probe pin, each of the at least one non-uniform sized probe pin has a current carrying capacity at least 25% larger than the current carrying capacity of each of the uniform sized probe pins.

10. The method of claim 9, wherein each of the uniform sized probe pins has a diameter of 2.5-3 mils.

11. The method of claim 10, wherein each of the at least one non-uniform sized probe pin has a diameter greater than 3.5 mils.

12. The method of claim 11, wherein each of the at least one non-uniform sized probe pin has a diameter between 3.5 mils to 5 mils.

13. The method of claim 9, wherein each of the uniform sized probe pins has a current carrying capacity of 75-100 milliamperes.

14. The method of claim 9, wherein each of the at least one non-uniform sized probe pin has a current carrying capacity of at least 125 milliamperes.

15. A method for fabricating a probe card, comprising:
providing an initial wafer probe card having uniform sized probe pins disposed at predetermined locations corresponding to bond pads for an integrated circuit to be probed while it is on a semiconductor wafer;
performing wafer probe tests on the integrated circuit using the wafer probe card;
identifying ones of the uniform sized probe pins that indicate damage due to current flow beyond the current carrying capacity of the uniform sized probe pins; and
forming another wafer probe card having uniform sized probe pins and non-uniform sized probe pins, the non-uniform sized probe pins being located at locations corresponding to the locations of the identified ones of the uniform sized probe pins;
wherein each of the non-uniform sized probe pins has a current carrying capacity at least 25% greater than each of the uniform sized probe pins.

16. The method of claim 15, wherein each of the uniform sized probe pins has a diameter of 2.5-3 mils.

17. The method of claim 15 wherein each of the non-uniform sized probe pins has a diameter of 3.5-4 mils.

18. The method of claim 15, wherein identifying ones of the uniform sized probe pins further comprises:
identifying locations of the bond pads for the integrated circuit to be probed by the initial wafer probe card during functional testing of the integrated circuit at a wafer probe station;
using a circuit simulation tool, simulating the current that flows at the identified locations of the bond pads during the functional testing;
comparing, for each location of the bond pads, the maximum current indicated by the circuit simulation tool to the current carrying capacity of a corresponding one of the uniform sized probe pins; and
identifying locations of the bond pads where the maximum current exceeds the current carrying capacity of the uniform sized probe pins.

19. The method of claim 15, wherein each of the uniform sized probe pins has a current carrying capacity of 75-100 milliamperes.

20. The method of claim 18, wherein each of the non-uniform sized probe pins has a maximum current carrying capacity of about 175 to about 250 milliamperes.

* * * * *